(12) United States Patent
Sasaki et al.

(10) Patent No.: US 7,446,458 B2
(45) Date of Patent: Nov. 4, 2008

(54) PIEZOELECTRIC CERAMIC ELEMENT AND PORTABLE DEVICE

(75) Inventors: Yasuhiro Sasaki, Tokyo (JP); Yasuharu Onishi, Tokyo (JP); Nozomu Toki, Tokyo (JP)

(73) Assignee: NEC Corporation, Tokyo (JP)

( * ) Notice: Subject to any disclaimer, the term of this patent is extended or adjusted under 35 U.S.C. 154(b) by 236 days.

(21) Appl. No.: 10/564,023

(22) PCT Filed: Aug. 27, 2004

(86) PCT No.: PCT/JP2004/012386

§ 371 (c)(1),
(2), (4) Date: Jan. 9, 2006

(87) PCT Pub. No.: WO2005/024966

PCT Pub. Date: Mar. 17, 2005

(65) Prior Publication Data

US 2006/0152112 A1    Jul. 13, 2006

(30) Foreign Application Priority Data

Sep. 4, 2003    (JP) ............................. 2003-312691

(51) Int. Cl.
H01L 41/08    (2006.01)
(52) U.S. Cl. ..................... 310/332; 310/328
(58) Field of Classification Search ......... 310/330–332, 310/324, 328
See application file for complete search history.

(56) References Cited

U.S. PATENT DOCUMENTS 3,378,704 A * 4/1968 Smith et al. ............... 310/366

4,237,399 A * 12/1980 Sakamoto .................. 310/317

(Continued)

FOREIGN PATENT DOCUMENTS

CN    1299153 A    6/2001

(Continued)

OTHER PUBLICATIONS

"Ultrasonic Electronics Vibration Theory—Basics and Applications"—(edited by Yoshiro Tomikawa, Asakura Publishing Co., Ltd., Feb. 20, 1998, pp. 104-131.

(Continued)

*Primary Examiner*—Mark Budd
(74) *Attorney, Agent, or Firm*—Scully, Scott, Murphy & Presser, P.C.

(57) ABSTRACT

Piezo-electric ceramic transducer 1 has upper piezo-electric active layer 5 and lower piezo-electric active layer 6. Upper insulating layer 2 and lower insulating layer 3, between which upper piezo-electric active layer 5 and lower piezo-electric active layer 6 are placed, are disposed on both surfaces of piezo-electric ceramic transducer 1 in a thickness direction thereof. Two electrode pads 8 and 9 are disposed on a surface of upper insulating layer 2. Electrode pads 8 and 9 are connected with upper electrode layers 7a and lower electrode layers 7b via connection members 12, and voltages are applied to upper piezo-electric active layer 5 and lower piezo-electric active layer 6 via electrode pads 8 and 9. Insulating layers 2, 3 and 4 and piezo-electric active layers 5 and 6 are made of the same material as one another and are integrated by sintering.

5 Claims, 10 Drawing Sheets

U.S. PATENT DOCUMENTS

| | | | | |
|---|---|---|---|---|
| 4,805,057 | A * | 2/1989 | Ogawa et al. | 360/292 |
| 5,103,361 | A * | 4/1992 | Nagatsuka et al. | 360/292 |
| 5,118,982 | A * | 6/1992 | Inoue et al. | 310/366 |
| 6,172,447 | B1 * | 1/2001 | Ishikawa et al. | 310/359 |
| 6,437,488 | B1 * | 8/2002 | Sube et al. | 310/366 |
| 6,573,638 | B1 * | 6/2003 | Yamamoto | 310/359 |
| 6,747,400 | B2 * | 6/2004 | Maichl et al. | 310/332 |

FOREIGN PATENT DOCUMENTS

| | | |
|---|---|---|
| CN | 1430291 A | 7/2003 |
| JP | 62-115788 | 5/1987 |
| JP | 03-128681 | 5/1991 |
| JP | 09-264879 | 10/1997 |
| JP | 2003-209302 | 7/2003 |

OTHER PUBLICATIONS

"Mechanical Quality Factor of Multilayer Piezoelectric Ceramic Transducers" (Yashuhiro Sasaki et al., Jpn, Appln. Phys. vol. 40 (2001), Part 1, No. 5B, pp. 3549-3551, May 2001).

* cited by examiner

PIEZOELECTRIC CERAMIC ELEMENT AND PORTABLE DEVICE

TECHNICAL FIELD

The present invention relates to a piezo-electric ceramic transducer which is warped and deformed due to a piezo-electric traverse effect, and a portable device using the piezo-electric ceramic transducer.

BACKGROUND ART

Recently, portable devices such as a portable telephone, a notebook-sized personal computer, a personal digital assistant (PDA) and the like have been frequently used. These portable devices have been served for various purposes of use with the development of network system and software, and convenience for users have been heightened. Hereby, types of functional components on-boarded in portable devices such as a speaker, a microphone, a receiver, a vibrator, a camera, a liquid crystal display, a card memory, LSI, an infrared ray communication module and the like tend to increase in number.

To heighten portability and convenience of portable devices, downsizing and thinned thickness of them have been required. However, increase of functional components used in portable devices have disturbed downsizing of the portable device. Further, when a portable device is dropped, functional components in the portable device may be broken due to collision of the functional components with each other or collision of the functional components with a case body. Therefore, it has become important to arrange the functional components and to design spaces among the functional components while considering to prevent this breakage of the functional components. Moreover, to come into wide use portable devices more, it is indispensable to develop techniques for manufacturing and installing parts at low cost in portable devices.

In portable devices, various movable parts driven in response to electric signals are used. As these movable parts, for example, in portable telephones, there are an acoustic device, a vibrator, a camera zoom mechanism and the like. And, in a personal computer and PDA having a cooling system of liquid cooling type, there is a coolant-circulating pump. Further, a battery is used for a portable device as an energy supply source. Therefore, because an electromagnetic type driving source such as a direct current (DC) motor or a magnetic force to mechanical force converter is possible to be driven at low voltage such as 3 to 5 V and is obtained at low cost, the electromagnetic type driving source is used as a driving source for driving movable parts.

However, because an electromagnetic coil or a permanent magnet is used for an electromagnetic type driving source, it is technically difficult to downsize the driving source while keeping a driving performance of the driving source. For example, in a portable telephone, an electromagnetic speaker is used as an acoustic device generating an incoming sound. However, the electromagnetic speaker has a thickness of about 3 mm. When the electromagnetic speaker is further downsized and thinned, performance of the electromagnetic speaker is undesirably lowered. Therefore, it is generally considered that downsizing and thinned thickness are difficult.

Therefore, as driving sources for movable parts described above, a piezo-electric ceramic transducer using no electro-magnetic function, having high electric-mechanical energy conversion efficiency and advantageous in downsizing and thinned thickness have attracted attention of users. A piezo-electric ceramic transducer is deformed when a direct current is applied to the transducer, and the piezo-electric ceramic transducer can move an object. Further, when an alternating current voltage of a desired frequency is applied to a piezo-electric ceramic transducer, the piezo-electric ceramic transducer is vibrated at the frequency. Therefore, the piezo-electric ceramic transducer can vibrate an object.

Various types piezo-electric ceramic transducers have been proposed as a mechanical driving source and are put to practical use. For example, in "Ultrasonic Electronics Vibration Theory—Basics and Applications—" (edited by Yoshiro TOMIKAWA, Asakura Publishing Co., Ltd., Feb. 20, 1998, pp. 104-131), a piezo-electric ceramic transducer warped and deformed due to a piezo-electric traverse effect and movement of the transducer are written in detail. An example of the piezo-electric ceramic transducer is shown in FIG. 1. FIG. 1 is a schematic view showing a conventional piezo-electric ceramic transducer. As shown in FIG. 1, conventional piezo-electric ceramic transducer 101 is structured by bonding two piezo-electric ceramic plates 103 and 104, which are polarized and have electrodes 105 on both principal surfaces, on both surfaces of thinned-plate shaped permanent elastic body 102, which is made of metallic material and functions as one of electrodes for applying voltages, with adhesives. Further, in this piezo-electric ceramic transducer 101, to apply a voltage to each of piezo-electric ceramic plates 103 and 104, a total of three lead wires 106 are connected to electrodes 105 and permanent elastic body 102, respectively. Such piezo-electric ceramic transducer 101 having a bonded structure of two piezo-electric ceramic plates 103 and 104 is generally called a bimorph type.

When a voltage is applied to piezo-electric ceramic plates 103 and 104 of piezo-electric ceramic transducer 101 while devising polarity of the piezo-electric ceramic plates 103 and 104 so as to contract one of piezo-electric ceramic plates 103 and 104 in a longitudinal direction thereof and to expand the other in a longitudinal direction thereof, piezo-electric ceramic transducer 101 is bended and displaced in a thickness direction thereof. This movement is generated in the same manner regardless of whether a flat surface of piezo-electric ceramic transducer 101 has any shape such as a rectangle, a square, a circle or the like. Further, when an alternating current voltage is applied to this piezo-electric ceramic transducer 101, piezo-electric ceramic transducer 101 is vibrated in a thickness direction thereof. When a frequency of the applied alternating current voltage is adjusted, resonance is observed in a natural period of piezo-electric ceramic transducer 101 determined by size, material and the like of piezo-electric ceramic transducer 101, and amplitude of piezo-electric ceramic transducer 101 is maximized.

Further, as described above, a battery having an output voltage of 3 to 5V is often used for a portable device as an energy source. However, it is generally known that piezo-electric ceramic transducer has a higher operational voltage as compared with that of an electromagnetic type driving source. To solve this problem, a multilayered type piezo-electric ceramic vibrator has been proposed. This vibrator is produced by alternately stacking thinned piezo-electric ceramic plates and electrodes, and can be driven at low voltage by heightening intensity of applied electric field. For example, as shown in FIG. 2, piezo-electric ceramic vibrator 111 obtained by alternately stacking electrode layers 115 and piezo-electric ceramic layers 113 has been disclosed in "Mechanical Quality Factor of Multilayer Piezoelectric Ceramic Transducers" (Yashuhiro SASAKI et al., Jpn. Appl. Phys. Vol. 40(2001), Part 1, No. 5B, pp. 3549-3551, May 2001). In FIG. 2, electrode layers 115 facing each other in each pair with one piezo-electric ceramic layer 113 between are wire-connected to first external electrode 116 so as to be electrically in parallel to each other. Further, second external electrodes 117 are formed on almost whole area of both principal surfaces of piezo-electric ceramic vibrator 111, and piezo-electric ceramic vibrator 111 is structured so as to lead out electric terminals (not shown) from these electrodes.

However, to actually apply a piezo-electric ceramic transducer, using a piezo-electric traverse effect and performing bending and displacing movement, to a portable device, there are problems described hereinafter.

First, to operate a bimorph type piezo-electric ceramic transducer shown in FIG. 1, it is required to lead out at lest one electric terminal lead wire from each of both principal surfaces of the piezo-electric ceramic transducer in a thickness direction of the piezo-electric ceramic transducer and one electric terminal lead wire from a permanent elastic body, that is, a total of three lines.

For movement of a mechanical driving source in a portable device, frequent movements and long-time stability are required. However, as the number of electric terminal lead wires becomes large, a possibility of disconnection is increased. Further, when a piezo-electric ceramic transducer is vibrated, a problem arises in that noises are generated due to acoustic radiation from electric terminal lead wires.

Further, because electric terminal lead wires are connected to both principal surfaces of a piezo-electric ceramic transducer in a thickness direction thereof, these electric terminal lead wires disposed on both principal surfaces of the piezo-electric ceramic transducer in the thickness direction becomes an obstacle. Because of these problems, not only a joining position to an object, to which displacement or vibration of piezo-electric ceramic transducer should be transmitted, is restricted, but also it is required to secure both an occupation space and a displacement movement space for electric terminal lead wires. Therefore, features of downsizing and thinned shape in a piezo-electric ceramic transducer are undesirably lost. Further, because electrodes are formed on both principal surfaces of a piezo-electric ceramic transducer in a thickness direction thereof, in case of the object made of metal, electric energy applied to the piezo-electric ceramic transducer is leaked to the object. Therefore, lowering of reliability caused by corrosion of the object is feared, and adverse influence on human bodies and/or noise mixture to other parts based on transmission of electric energy to a structured element such as a housing of a portable device and the like through the object are feared.

Secondly, when a mechanical driving source is installed in a portable device, a small size and a thin shape not obtained in the past are required. In this case, piezo-electric ceramic plates (piezo-electric layers) constituting a piezo-electric ceramic transducer and a permanent elastic body are inevitably made in a thin plate shape. In a sintering process for piezo-electric ceramic plates, when a thin plate is sintered, sintering distortion is generated in the thin plate. This sintering distortion generates errors in size of electrodes and degradation of characteristics of piezo-electric material. Further, in a process for joining a permanent elastic body to a piezo-electric ceramic plate, mismatching is generated on a surface of the piezo-electric ceramic plate joined to the permanent elastic body. Because of irregularity in the joining process, reliability of the piezo-electric ceramic transducer is lowered. To lessen the sintering distortion, a pre-body of a piezo-electric ceramic plate is formed in a size larger than a final size of the piezo-electric ceramic plate, and this pre-body is sintered. Thereafter, grinding and polishing are performed for the sintered body, so that the plate having a desired size is obtained. Due to these processes, manufacturing cost of the piezo-electric ceramic plates is increased.

Further, because each piezo-electric ceramic plate is a thin plate, defects such as breakage, crack and/or the like are easily generated in the piezo-electric ceramic plate during handling in a manufacturing process. This induces lowering of yield. As a result, manufacturing cost is increased.

Thirdly, there is a problem in a frequency band when a piezo-electric ceramic transducer is vibrated. Now it is considered to obtain vibration of a desired frequency by using a piezo-electric ceramic transducer. Amplitude of a piezo-electric ceramic transducer is increased at a resonance frequency of the piezo-electric ceramic transducer, but the amplitude is extremely attenuated at a frequency lowered than a fundamental resonance frequency of the piezo-electric ceramic transducer. That is, in a case where the fundamental resonance frequency can be adjusted according to a required frequency, convenience is improved. As an example, in case of application of a piezo-electric ceramic transducer to a speaker, when the piezo-electric ceramic transducer has two or more resonance frequencies within a region of 300 Hz to 1 kHz in an audible band, levels of sound pressure in a low sound region are equalized. Therefore, a speaker having preferable tone quality can be substantiated such that the speaker reproduces faithfully sound of a low sound region, though it is difficult to reproduce sound of the low sound region by using a conventional speaker using a piezo-electric ceramic transducer.

However, a fundamental resonance frequency is uniquely determined based on physical properties and shape of material constituting a piezo-electric ceramic transducer, so that it is difficult to arbitrarily change a resonance frequency in a single piezo-electric ceramic transducer. Therefore, to have two or more resonance frequencies, it is required to manufacture a plurality of piezo-electric ceramic transducers having different shapes. As a result, because manufacturing cost of such piezo-electric ceramic transducers are increased, possibility of application of these piezo-electric ceramic transducers to a mechanical driving source of a portable device is lowered in practical use.

DISCLOSURE OF THE INVENTION

A first object of the present invention is to provide, in consideration of the problems, a piezo-electric ceramic transducer, having a high reliability in operation and easiness in manufacturing while having features of both downsizing and thinned thickness in the piezo-electric ceramic transducer, and a portable device using the piezo-electric ceramic transducer.

In addition to the above object, a second object of the present invention is to provide a piezo-electric ceramic transducer adjustable its fundamental resonance frequency and a portable device using this.

To achieve the first object, a piezo-electric ceramic transducer according to the present invention is a piezo-electric ceramic transducer to be bent and displaced in a thickness direction thereof by applying voltage to the transducer, the transducer comprises two piezo-electric active layers, each of which has at least a piezo-electric layer and to which voltages are, respectively, applied through electrode layers such that one of the piezo-electric active layer expands and the other one contracts, two insulating layers, between which the two piezo-electric active layers are placed, disposed on both surfaces of the piezo-electric ceramic transducer in a thickness direction of the piezo-electric ceramic transducer, respectively, and an electrode pad disposed on only one of the two insulating layers and electrically connected with the electrode layers. The piezo-electric active layers and the insulating layers are made of the same material as one another and are integrally formed with one another by sintering.

As described above, the two piezo-electric active layers are placed between the two insulating layers, and the two insulating layers are, respectively, disposed on both surfaces of the piezo-electric ceramic transducer in the thickness direction of the transducer. Therefore, an electrical connection with the electrode layers can be led to only one of the insulating layers. As a result, a lead wire for electrical connection with the outside can be led from only one surface of the piezo-electric ceramic transducer. Accordingly, the downsizing and thinned thickness in the piezo-electric ceramic transducer including the lead wire can be achieved. Further, because the piezo-electric active layers and the insulating layers are made of the same material as one another and are formed integrally with each other by sintering, a joining process based on sticking of the layers on each other is unnecessary. Thereby, a manufacturing process is simplified, and reliability against mechanical breakage of the piezo-electric ceramic transducer is improved.

Further, because the electrode pad is disposed on only one surface of the piezo-electric ceramic transducer, an object, to which displacement of the piezo-electric ceramic transducer should be transmitted, can be joined to the whole surface opposite to the surface on which the electrode pad of the piezo-electric ceramic transducer is disposed. Accordingly, the displacement of the piezo-electric ceramic transducer is efficiently transmitted to the object. Further, in the piezo-electric ceramic transducer, the layers are integrally formed with one another, and sintering distortion is extremely lowered. Therefore, when the piezo-electric ceramic transducer and the object are joined to each other, mechanical working such as polishing and the like is unnecessary. Therefore, the joining process can be easily performed. In addition, because a surface, to which the object is joined, is an insulating layer, even though the object is made of metal, the piezo-electric ceramic transducer can be joined to the object. Accordingly, an installation position of the piezo-electric ceramic transducer according to the present invention is not limited.

Each piezo-electric active layer may be constituted by a single piezo-electric layer, or may be constituted by a plurality of piezo-electric layers separated from one another by the electrode layers.

Further, it is preferred that the piezo-electric ceramic transducer according to the present invention has also an intermediate insulating layer between the two piezo-electric active layers. Thereby, a piezo-electric effect caused by the two piezo-electric active layers is more effectively produced, and the number of lead wires led to the outside can be reduced. Further, as to polarization directions of the two piezo-electric active layers, it is preferred that polarization directions of the two piezo-electric layers closest to each other in relation between one piezo-electric active layer and the other piezo-electric active layer be the same as each other. Thereby, voltage applied in a polarization process and in a driving period of time can be lowered.

It is preferred that an elastic body may be joined to at least one of the two insulating layers in the piezo-electric ceramic transducer according to the present invention. Both a displacement and a fundamental resonance frequency of the piezo-electric ceramic transducer can be adjusted by appropriately selecting material, size and the like of the elastic body. Further, Both the displacement and the fundamental resonance frequency of the piezo-electric ceramic transducer can be adjusted by attaching a stationary part to the piezo-electric ceramic transducer and joining an elastic body to the stationary part such that a displacement of the stationary part becomes lower than the displacement of the piezo-electric ceramic transducer at an end of the piezo-electric ceramic transducer. In this case, a piezo-electric ceramic transducer having two different fundamental resonance frequencies can be made by attaching the stationary part at a position different from a position of the center of the piezo-electric ceramic transducer, and a band of the vibration frequency can be widened. Further, when the elastic body is formed into a box and a piezo-electric ceramic transducer is attached to the inside of the box, a non-directivity acoustic device performing acoustic radiation from the whole box by vibrating the whole box.

A portable device according to the present invention comprises the above-described piezo-electric ceramic transducer according to the present invention, and a part, joined to the piezo-electric ceramic transducer, to which displacement of the piezo-electric ceramic transducer is transmitted. Further, a portable device according to the present invention comprises the above-described piezo-electric ceramic transducer according to the present invention, a stationary part attached to the piezo-electric ceramic transducer, and an elastic body joined to the stationary part such that a displacement of the stationary part becomes smaller than a displacement of the piezo-electric ceramic transducer at an end thereof. Acoustic radiation is performed from this elastic body. In this case, it is preferred that the elastic body be a case body of the portable device.

In the present invention, the piezo-electric ceramic transducer having high reliability in operation or movement and easily manufactured, while having features of downsizing and thinned thickness in the piezo-electric ceramic transducer, can be obtained. As a result, the piezo-electric ceramic transducer according to the present invention can be installed in a narrow space. Further, because reliability in movement is high, the piezo-electric ceramic transducer can be preferably used as a driving source of a part of the portable device accompanied by mechanical displacement.

Further, a fundamental resonance frequency can be adjusted by directly joining the elastic body to the piezo-electric ceramic transducer or joining the elastic body through the stationary part to the piezo-electric ceramic transducer. Therefore, the present invention can be also used appropriately as an acoustic device. Particularly, when the stationary part is disposed, a band of the vibration frequency can be widened by placing the stationary part at a position different from a position of the center of the piezo-electric ceramic transducer. Further, when the elastic body is formed into a box and the piezo-electric ceramic transducer is joined to the inside of the box, the piezo-electric ceramic transducer can acts as a non-directivity acoustic device performing acoustic radiation from the whole box.

BEST MODE FOR CARRYING OUT THE INVENTION

First Embodiment

Figure 3:
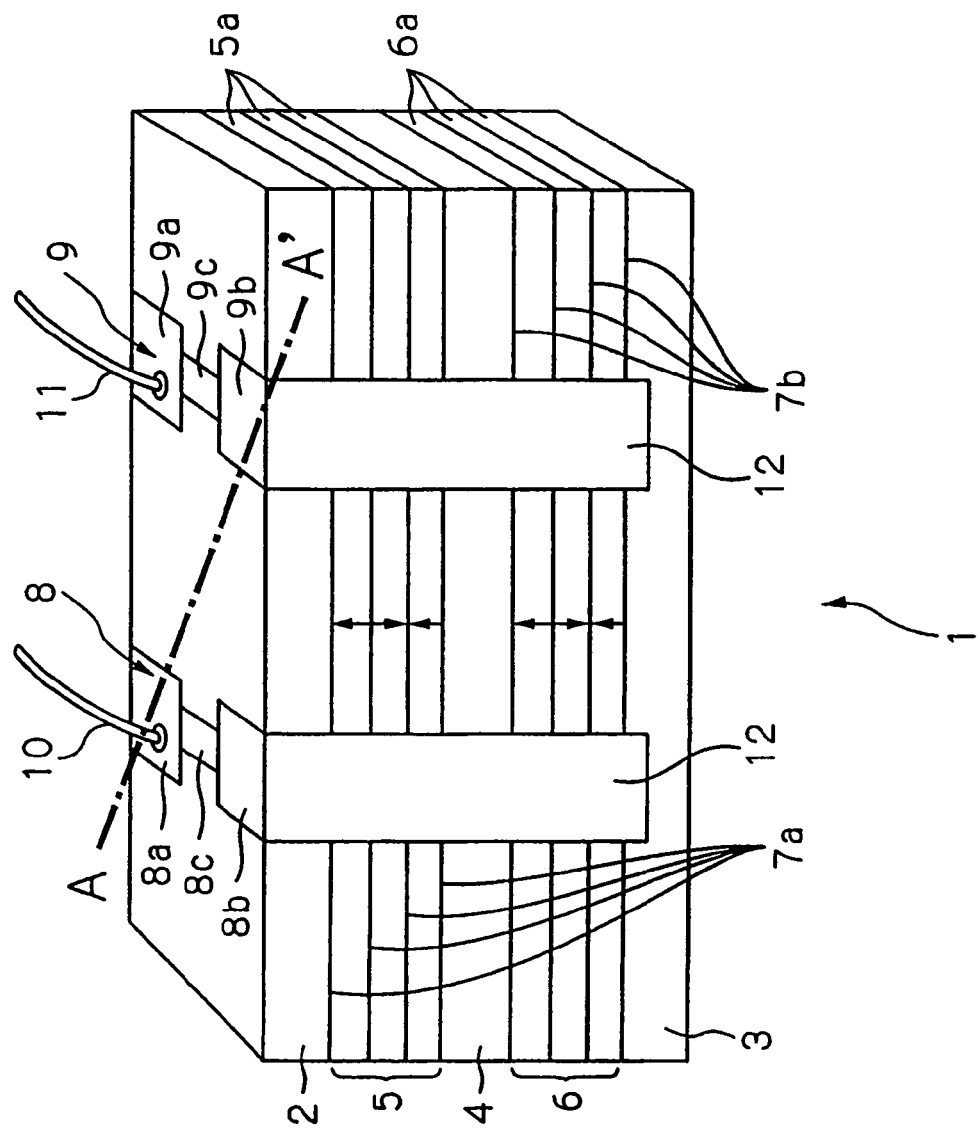
[FIG. 3] A schematic view showing a piezo-electric ceramic transducer according to a first embodiment of the present invention.

Referring to FIG. 3, a schematic view of piezo-electric ceramic transducer 1 according to a first embodiment of the present invention is shown.

Piezo-electric ceramic transducer 1 shown in FIG. 3 is a bimorph type bendable device having two piezo-electric active layers composed of upper piezo-electric active layer 5 and lower piezo-electric active layer 6 and is bent and displaced in a thickness direction of piezo-electric ceramic transducer 1 when a voltage is applied to piezo-electric ceramic transducer 1 through electrode pads 8 and 9. When the applied voltage is a direct current voltage, piezo-electric ceramic transducer 1 is displaced towards one direction. When the applied voltage is an alternating current voltage, piezo-electric ceramic transducer 1 is vibrated. The vibration is periodical repetition of bends and displacements in opposite directions. Therefore, in following descriptions, when the vibration is not particularly distinguished from the displacement, the vibration is sometimes merely called "displacement".

In FIG. 3, to easily realize configuration of layers constituting piezo-electric ceramic transducer 1, piezo-electric ceramic transducer 1 is drawn in a large size along the thickness direction. However, piezo-electric ceramic transducer 1 actually has a thinned plate shape as a whole. Further, in following descriptions, words "upper" and "lower" are used to indicate position and/or direction. These words denote upper and lower in conditions shown in the drawings, and not denote upper and lower in conditions that piezo-electric ceramic transducer 1 is actually used.

Intermediate insulating layer 4 is disposed between upper piezo-electric active layer 5 and lower piezo-electric active layer 6. Upper insulating layer 2 is disposed on a surface of upper piezo-electric active layer 5 opposite to a surface on which intermediate insulating layer 4 is disposed, and lower insulating layer 3 is disposed on a surface of lower piezo-electric active layer 6 opposite to a surface on which intermediate insulating layer 4 is disposed. Upper insulating layer 2 constitutes a top layer of piezo-electric ceramic transducer 1, and lower insulating layer 3 constitutes a lowest layer of piezo-electric ceramic transducer 1.

Upper piezo-electric active layer 5 has a multilayered structure of three upper piezo-electric layers 5a. Upper electrode layers 7a are, respectively, disposed between upper piezo-electric layers 5a adjacent to each other, between highest upper piezo-electric layer 5a and upper insulating layer 2, and between lowest upper piezo-electric layer 5a and intermediate insulating layer 4. In the same manner, lower piezo-electric active layer 6 has a multilayered structure of three lower piezo-electric layers 6a. Lower electrode layers 7b are, respectively, disposed between lower piezo-electric layers 6a adjacent to each other, between highest lower piezo-electric layer 6a and intermediate insulating layer 4, and between lowest lower piezo-electric layer 6a and lower insulating layer 3.

After the layers described above, that is, upper insulating layer 2, upper piezo-electric active layer 5, upper electrode layers 7a, intermediate insulating layer 4, lower piezo-electric active layer 6, lower electrode layers 7b and lower insulating layer 3 are stacked in a multilayered arrangement described above, the layers are sintered to be integrally formed. These layers can be formed according to a green sheet method used for production of ceramic condenser or the like.

By sintering the layers constituting piezo-electric ceramic transducer 1 after the stacking of the layers in a multilayered structure, thickness and weight of a sintered object become large as compared with a case where each of the layers are separately sintered. As a result, a degree of sintering distortion in a sintering process becomes considerably lowered, so that a mechanical working process such as grinding and polishing can become unnecessary after sintering. Further, because integration of the layers is obtained by sintering, a joining process for joining the layers to each other for integration of the layers is unnecessary. Therefore, a manufacturing process for piezo-electric ceramic transducer 1 is reduced, so that piezo-electric ceramic transducer 1 can be manufactured at low cost. Further, because there are no portions joined with adhesives in boundary portions of the layers, reliability against mechanical breakage is improved.

Since the layers are integrated by sintering, it is preferred that upper insulating layer 2, upper piezo-electric layers 5a, intermediate insulating layer 4, lower piezo-electric layer 6a and lower insulating layer 3 be made of the same material as one another. Because coefficients of thermal expansion of the layers become equal to one another by making the layers of the same material, behavior of the layers during the sintering become the same as one another. Accordingly, the integration based on the sintering can be performed more preferably. As material of these layers, for example, lead zirconate and titanate type ceramics can be used. Further, when silver-palladium alloy is used as material of upper electrode layers 7a and lower electrode layers 7b to be simultaneously sintered, uniform sintering is promoted, and there is an effect that sintering distortion is further reduced.

Two electrode pads 8 and 9 are disposed on an upper surface of upper insulating layer 2, and lead wires 10 and 11 are electrically connected to these electrode pads 8 and 9. Electrode pad 8 has two pad portions 8a and 8b for polarization, disposed on ends of the upper surface of upper insulating layer 2 opposite to each other and coupling portion 8c for combining and electrically connecting polarization pad portions 8a and 8b with each other. In the same manner, the other electrode pad 9 has two pad portions 9a and 9b for polarization and coupling portion 9c. Further, four wire connection members 12, for example, made of conductive material such as metallic foil, metallic film or the like are disposed on side surfaces of piezo-electric ceramic transducer 1. Wire connection members 12 are, respectively, electrically connected with polarization pad portions 8a, 8b, 9a and 9b, and each connection members 12 is electrically connected with predetermined electrode layers selected from among upper electrode layers 7a and lower electrode layers 7b.

When a polarization process is performed for upper piezo-electric layers 5a and lower piezo-electric layers 6a in a pre-body of piezo-electric ceramic transducer 1 sintered and integrated as described above, polarization pads 8a, 8b, 9a and 9b are used to apply voltages through upper electrode layers 7a and lower electrode layers 7b. Coupling portions 8c and 9c are disposed after the polarization process. Therefore, four polarization pads 8a, 8b, 9a and 9b are independent from one another until the polarization process is completed.

As described above, wire connection members 12 are electrically connected with polarization pads 8a, 8b, 9a and 9b, respectively. Two of four wire connection members 12 are alternately connected with either upper electrode layers 7a or lower electrode layers 7b in a stacked order of the layers. The other two ones of four wire connection members 12 are alternately connected with the other electrode layers in a stacked order of the layers. Therefore, two of polarization pads 8a, 8b, 9a and 9b can be used to polarize either upper piezo-electric layers 5a or lower piezo-electric layers 6a, and the other two ones of polarization pads 8a, 8b, 9a and 9b can be used to polarize the other upper piezo-electric layers 5a or lower piezo-electric layers 6a. After completion of the polarization process, polarization pads used for polarization of upper piezo-electric layers 5a are, respectively, connected electrically with polarization pads used for polarization of lower piezo-electric layers 6a by using coupling portions 8c and 9c so as to connect polarization pads, to which voltages of opposite polarities are applied during the polarization process, with each other. Then, the manufacturing of piezo-electric ceramic transducer 1 is completed.

Figure 4:
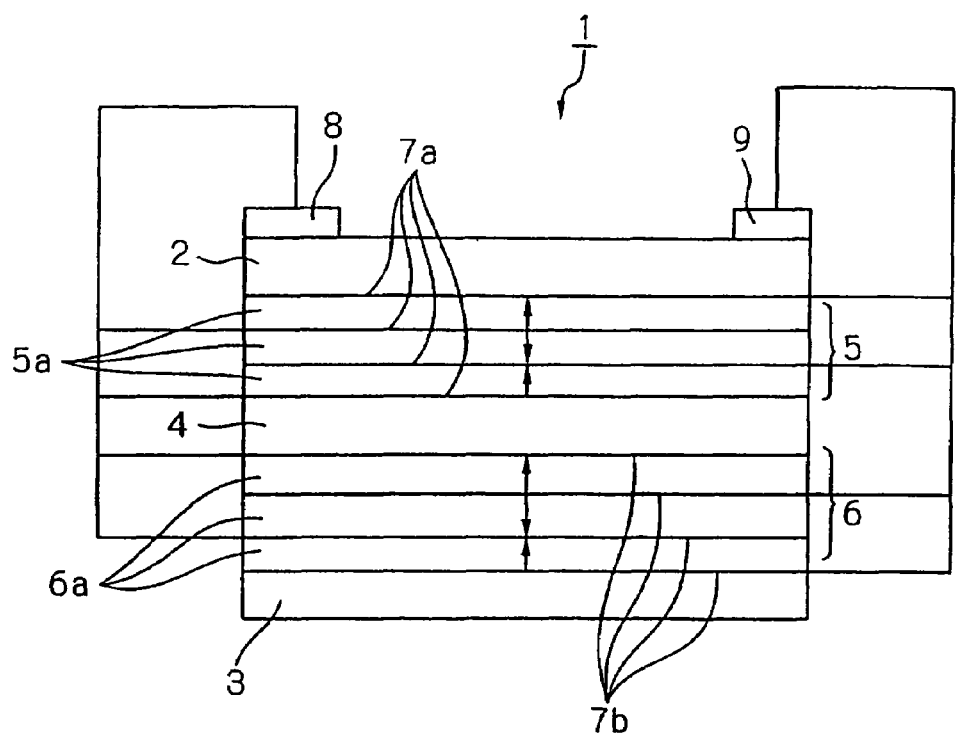
[FIG. 4] A sectional view taken along line A-A' of FIG. 3.

Wire connection conditions of the electrode layers according to this embodiment are described with reference to FIG. 4.

In the present embodiment, as shown in arrows, upper piezo-electric layers 5a and lower piezo-electric layers 5b are polarized in a polarization process so as to make polarization directions of upper piezo-electric layers 5a be the same as those of lower piezo-electric layers 6a adjacent to upper piezo-electric layers 5a through intermediate insulating layer 4 in a vertical direction and to make polarization directions of piezo-electric layers adjacent to each other be opposite to each other. That is, upper piezo-electric layers 5a and lower piezo-electric layers 5b are polarized so as to make polarization directions of whole upper piezo-electric active layer 5 be the same as those of whole lower piezo-electric active layer 6. After completion of the polarization process, as shown in FIG. 4, each upper electrode layer 7a and one lower electrode layer 7b adjacent to each other through intermediate insulating layer 4 in a vertical direction are electrically short-circuited each other, and upper piezo-electric active layer 5 and lower piezo-electric active layer 6 are wire-connected so as to be electrically parallel to each other.

Figure 5A:
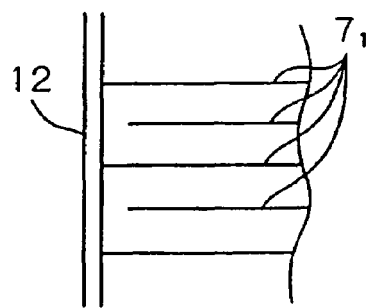
[FIG. 5A] A view explaining an example of a method for connecting a predetermined piezo-electric layer to an electrode pad in FIG. 4.
Figure 5B:
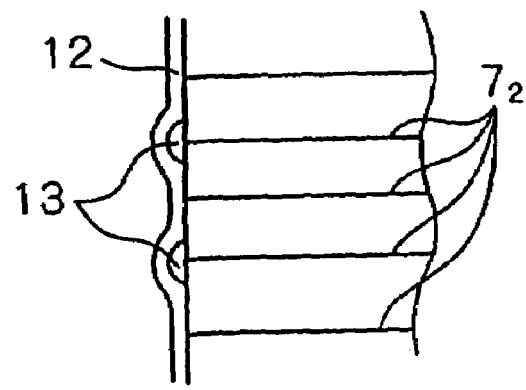
[FIG. 5B] A view explaining another example of a method for connecting a predetermined piezo-electric layer to an electrode pad in FIG. 4.

As a means for wire-connecting only the predetermined electrode layers selected from among upper electrode layers 7a and lower electrode layers 7b to electrode pads 8 and 9, a well-known means can be used. Some examples of the means are shown in FIG. 3. In an example shown in FIG. 5A, electrode layers $7_1$ are made to be partial electrodes, and predetermined electrode layers $7_1$ are formed in a pattern in which predetermined electrode layers $7_1$ are exposed to a side end surface of a piezo-electric active layer. Then, only predetermined electrode layers $7_1$ are wire-connected by disposing wire connection member 12 on the side end surface of the piezo-electric active layer. In an example shown in FIG. 5B, electrode layers $7_2$ are made to be electrodes extending all over the surface, and a part of electrode layers $7_2$ not to be wire-connected to a side end surface of a piezo-electric active layer are coated with insulator 13 such as glass or the like. Then, wire connection member 12 is disposed so as to pass on insulator 13, so that only predetermined electrode layers $7_2$ are wire-connected.

When polarization and wire-connection described above are performed, the number of lead wires 10 and 11 led to the outside can be reduced to two and be lessened as compared with that of a conventional bimorph type bendable device. Therefore, a possibility of failures in operation caused by disconnection of lead wire or the like is reduced, and noises based on acoustic radiation generated from lead wires by vibration of piezo-electric ceramic transducer 1 is reduced. As a result, reliability of piezo-electric ceramic transducer 1 can be improved.

Because upper insulating layer 2 and lower insulating layer 3 are disposed, two electrode pads 8 and 9 can be arranged on upper insulating layer 2, and an object (not shown), to which displacement or vibration of piezo-electric ceramic transducer 1 should be transmitted, can be attached to the whole lower surface of lower insulating layer 3. Therefore, displacement or vibration of piezo-electric ceramic transducer 1 can be efficiently transmitted while achieving reduction of space required to install piezo-electric ceramic transducer 1 in an apparatus.

Further, because the object is joined to lower insulating layer 3, even when the object is a conductive member made of metal or the like, no electrical energy leaks to the object. Accordingly, not only lowering of reliability of operation caused by corrosion of the object or the like is prevented, but also danger to human bodies caused by the transmission of electrical energy to the human bodies through the object and/or noise mixture to other parts can be prevented. Further, as described above, in piezo-electric ceramic transducer 1, the layers constituting piezo-electric ceramic transducer 1 are integrated by sintering, and sintering distortion is considerably lowered. Therefore, the object can be easily joined to piezo-electric ceramic transducer 1.

Electrode pads 8 and 9 are disposed on a portion of upper insulating layer 2. Therefore, an object, to which displacement or vibration of piezo-electric ceramic transducer 1 should be transmitted, can be joined to an upper surface of upper insulating layer 2 when being placed at a position differing from an area of electrode pads 8 and 9, or can be joined to both upper insulating layer 2 and lower insulating layer 3. Here, an example of disposing electrode pads 8 and 9 on upper insulating layer 2 is shown. However, electrode pads 8 and 9 can be disposed on lower insulating layer 3.

Intermediate insulating layer 4 has a function for mechanically separating upper piezo-electric active layer 5 and lower piezo-electric active layer 6 from each other. When piezo-electric ceramic transducer 1 is operated, one piezo-electric active layer expands while the other simultaneously contracts. At this time, because intermediate insulating layer 4 mechanically keeping a neutral condition exists between both active layers, a piezo-electric effect of upper piezo-electric active layer 5 and lower piezo-electric active layer 6 can be produced more effectively. Further, electrode layers, respectively, arranged on upper and lower surfaces of intermediate insulating layer 4 among upper electrode layers 7a and lower electrode layers 7b are electrically short-circuited with each other. Therefore, intermediate insulating layer 4 according to the present embodiment has a function different from that of an electrically insulating layer of a piezo-electric ceramic transformer using a piezo-electric longitudinal effect or a piezo-electric traverse effect generally proposed. The piezo-electric ceramic transformer basically has a four-terminal structure having two terminals on each of a primary side (input side) and a secondary side (output side), and the electrically insulating layer of the piezo-electric ceramic transformer electrically insulates the primary side and the secondary side from each other.

Further, in the present embodiment, as to insulating layers, there are three kinds of insulating layers composed of upper insulating layer 2, lower insulating layer 3 and intermediate insulating layer 4. Thickness of whole piezo-electric ceramic transducer 1 can be adjusted by adjusting thickness of these insulating layers. As a result, the sintering distortion and/or stiffness of piezo-electric ceramic transducer 1 can be adjusted. A displacement of piezo-electric ceramic transducer 1 can be adjusted due to adjustment of stiffness of piezo-electric ceramic transducer 1.

The present embodiment was described with reference to FIG. 3 and others. However, the piezo-electric ceramic transducer according to this embodiment is not limited to the configuration shown in FIG. 3 and others, and various modifications can be added.

For example, an example that each of upper piezo-electric active layer 5 and lower piezo-electric active layer 6 is composed of a plurality of piezo-electric layers was indicated. However, each of active layers 5 and 6 may be a single layer. Further, the number of piezo-electric layers in upper piezo-electric active layer 5 may differ from that in lower piezo-electric active layer 6. Because a displacement in a piezo-electric active layer depends on the number of piezo-electric layers, displacement in whole piezo-electric ceramic transducer 1 can be biased by making the number of piezo-electric layers in upper piezo-electric active layer 5 differ from that in lower piezo-electric active layer 6.

As to polarization direction, in the example described above, a total of polarization directions in upper piezo-electric active layer 5 is the same as that in lower piezo-electric active layer 6. However, in the present invention, it is not required that polarization directions in upper piezo-electric active layer 5 is the same as that in lower piezo-electric active layer 6. Further, in a case where the number of piezo-electric layers composing a piezo-electric active layer is an even number, it seems that polarization directions of the piezo-electric layers in a whole piezo-electric active layer are cancelled out. However, the present invention can be also applied in this case.

Figure 6A:
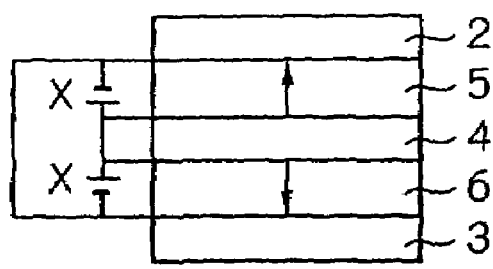
[FIG. 6A] A view schematically showing application of voltage in a polarization process for a piezo-electric ceramic transducer wherein polarization directions in upper piezo-electric active layer differ from those in lower piezo-electric active layer.
Figure 6B:
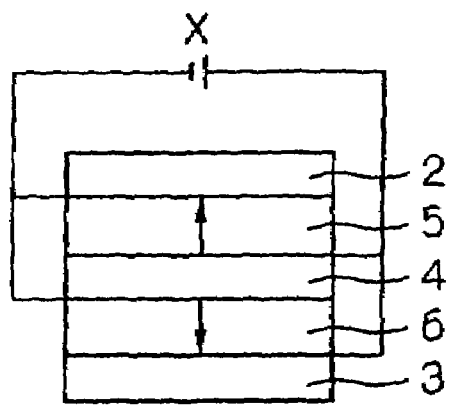
[FIG. 6B] A view schematically showing application of voltage in a driving operation of a piezo-electric ceramic transducer wherein polarization directions in upper piezo-electric active layer differ from those in lower piezo-electric active layer.

In a case where polarization directions in a upper piezo-electric active layer differ from those in a lower piezo-electric active layer, application of voltage in a polarization process and application of voltage in a driving operation are schematically shown in FIGS. 6A and 6B, respectively. FIG. 6A shows application of voltage in a polarization process, and a direct current voltage X(V) is applied through four polarization pad portions 8a, 8b, 9a and 9b (see FIG. 3) so as to make a direction of electric field applied to upper piezo-electric active layer 5 be opposite to that applied to lower piezo-electric active layer 6. Therefore, upper piezo-electric active layer 5 and lower piezo-electric active layer 6 are polarized in directions indicated by arrows, respectively. FIGS. 6A and 6B show upper piezo-electric active layer 5 and lower piezo-electric active layer 6 as if they have a single piezo-electric layer. However, FIGS. 6A and 6B do not prescribe the number of piezo-electric layers. In a case where a piezo-electric active layer has a plurality of piezo-electric layers, each arrow indicating one polarization direction indicates a total of polarization direction of the piezo-electric layers. Further, an electrode layer is disposed in each boundary between layers. These are the same as those in FIGS. 7A and 7B described below.

After completion of the polarization process, as shown in FIG. 6B, upper piezo-electric active layer 5 and lower piezo-electric active layer 6 are wire-connected with each other by electrically connecting polarization pad portions 8a, 8b, 9a and 9b to each other by coupling portions 8c and 9c (see FIG. 3). Thereafter, voltage X(V) is applied such that an electrical field, for example, having the same direction as a polarization direction of upper piezo-electric active layer 5 acts on upper piezo-electric active layer 5 and an electrical field having a direction opposite to a polarization direction of lower piezo-electric active layer 6 acts on lower piezo-electric active layer 6. Thereby, upper piezo-electric active layer 5 expands, and lower piezo-electric active layer 6 simultaneously contracts. Therefore, the piezo-electric ceramic transducer is bended and displaced upward.

However, as shown in FIGS. 6A and 6B, in a case where polarization directions of upper piezo-electric active layer 5 and lower piezo-electric active layer 6 are opposite to each other, a driving voltage is undesirably applied to intermediate insulating layer 4. Therefore, when a thickness of intermediate insulating layer 4 is thinner than thickness of upper piezo-electric active layer 5 and lower piezo-electric active layer 6, intermediate insulating layer 4 itself is polarized so as to act to cancel out displacements. Therefore, because a thickness of intermediate insulating layer 4 is restricted, it is preferred that polarization directions of upper piezo-electric active layer 5 and lower piezo-electric active layer 6 are the same as each other.

As described above, intermediate insulating layer 4 has a function for mechanically separating upper piezo-electric active layer 5 and lower piezo-electric active layer 6 from each other. However, intermediate insulating layer 4 is not necessary for the present invention.

Figure 7A:
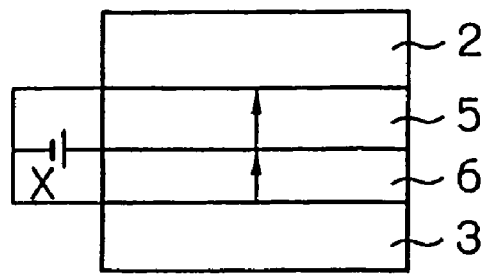
[FIG. 7A] A view schematically showing application of voltage at a driving time in a case where polarization directions in a piezo-electric ceramic transducer having no intermediate insulating layer are the same as each other.
Figure 7B:
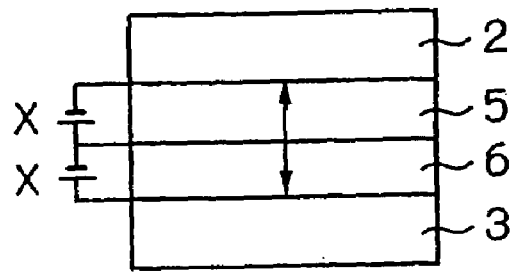
[FIG. 7B] A view schematically showing application of voltage at a driving time in a case where polarization directions in a piezo-electric ceramic transducer having no intermediate insulating layer are opposite to each other.

An example of a piezo-electric ceramic transducer having no intermediate insulating layer is shown in FIGS. 7A and 7B. FIG. 7A shows an example that polarization directions of upper piezo-electric active layer 5 and lower piezo-electric active layer 6 are the same as each other. FIG. 7B shows an example that polarization directions of upper piezo-electric active layer 5 and lower piezo-electric active layer 6 are opposite to each other. In any of these cases, electrode layers 7 placed in boundaries of upper piezo-electric active layer 5 and boundaries of lower piezo-electric active layer 6 are used in common for upper piezo-electric active layer 5 and lower piezo-electric active layer 6.

As described above, even in a case where no intermediate insulating layer is disposed, a piezo-electric ceramic transducer possible to be bended and displaced can be obtained by appropriately changing an electrical connection pattern for upper piezo-electric active layer 5 and lower piezo-electric active layer 6. Here, in a case where no intermediate insulating layer is disposed, the number of lead wires undesirably becomes three (that is, the number of electrode pads and the number of wire connection members become three together). However, because upper insulating layer 2 and lower insulating layer 3 are disposed, electrode pads (not shown) are disposed on only one surface of a piezo-electric ceramic transducer in a thickness direction thereof, and an object, to which displacement or vibration of this piezo-electric ceramic transducer should be transmitted, can be joined to the whole surface opposite to the surface. Accordingly, the effects described above can be obtained.

Further, in the present embodiment, piezo-electric ceramic transducer 1 independently driven was described. However, a displacement and a fundamental resonance frequency of piezo-electric ceramic transducer 1 can be adjusted by joining an elastic body to piezo-electric ceramic transducer 1.

Figure 8:
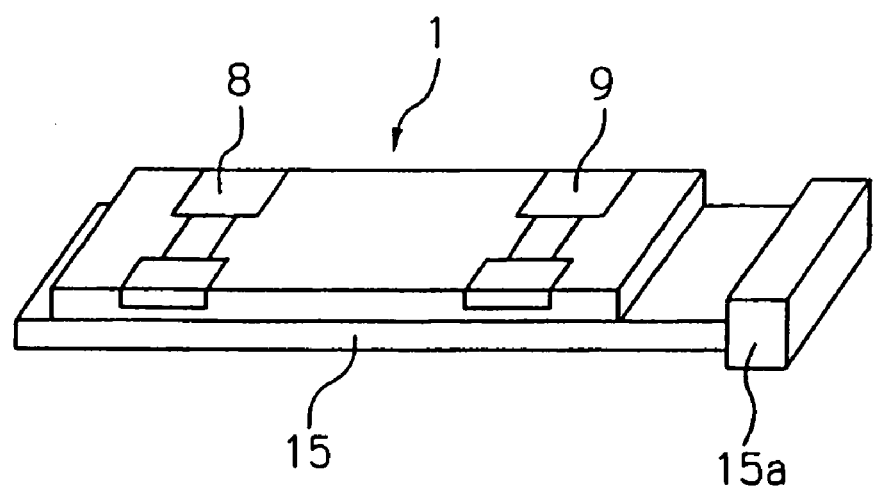
[FIG. 8] A perspective side view of a piezo-electric ceramic transducer joined to an elastic body.
Figure 9:
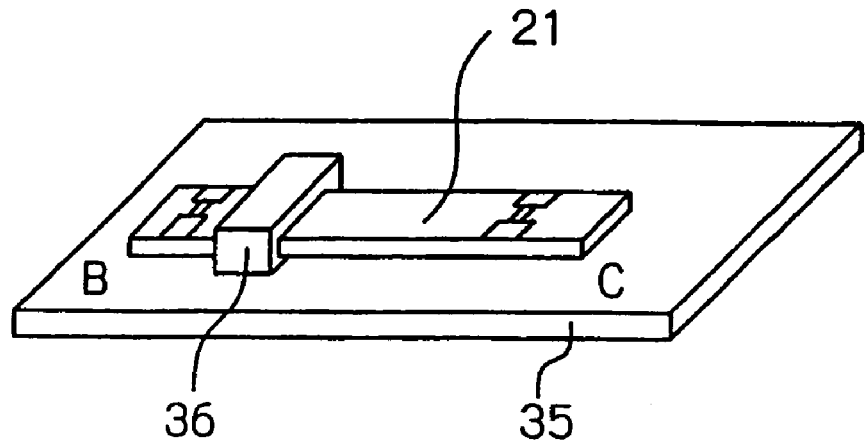
[FIG. 9] A schematic view showing an acoustic device using a piezo-electric ceramic transducer, according to a second embodiment of the present invention.

A perspective view of a piezo-electric ceramic transducer joined to an elastic body is shown in FIG. 8. In FIG. 8, elastic body 15 having fixed end 15a at one end portion thereof is joined to a whole lower surface of piezo-electric ceramic transducer 1. Elastic body 15 is a member formed in a thin plate shape and can be, for example, made of phosphor bronze.

As compared with a piezo-electric ceramic transducer not joining elastic body 1, a displacement of piezo-electric ceramic transducer 1 can be enlarged by joining elastic body 1 to piezo-electric ceramic transducer 1, and a fundamental resonance frequency of piezo-electric ceramic transducer 1 can also be lowered. The displacement and the fundamental resonance frequency depend on material, size and the like of elastic body 15. As to a length of elastic body 15 along a longitudinal direction of piezo-electric ceramic transducer 1, as a length of elastic body 15 is lengthened, the displacement is enlarged, and a fundamental resonance frequency is further lowered. In addition, the displacement and the fundamental resonance frequency of piezo-electric ceramic transducer 1 can be easily adjusted at low cost by changing only elastic body 15 without changing a size of piezo-electric ceramic transducer 1.

As described above, because sintering distortion in piezo-electric ceramic transducer 1 is lowered, elastic body 15 can be easily joined to piezo-electric ceramic transducer 1. Further, there are insulating layers on both surfaces of piezo-electric ceramic transducer 1 in a thickness direction thereof. Therefore, when elastic body 15 is disposed on the surface not having electrode pads 8 and 9 disposed or is disposed at a position different from an area of electrode pads 8 and 9 on the surface having electrode pads 8 and 9 disposed, even though elastic body 1 is metal, leaking of electrical energy through elastic body 1 does not occur. An object, to which displacement of piezo-electric ceramic transducer 1 should be transmitted, can be joined to a surface of piezo-electric ceramic transducer 1, to which elastic body 15 is not joined, or be joined to elastic body 15.

Second Embodiment

Referring to FIG. 8, a perspective view of an acoustic device using a piezo-electric ceramic transducer according to a second embodiment of the present invention is shown.

In the present embodiment, stationary part 36 is attached to piezo-electric ceramic transducer 21, and stationary part 36 is fixed to elastic body 35. Because piezo-electric ceramic transducer 21 is the same as that described in the first embodiment, detailed description of piezo-electric ceramic transducer 21 is omitted. Stationary part 36 changes a displacement behavior of piezo-electric ceramic transducer 21, and material of stationary part 36 is not particularly restricted on condition that the material can be joined to piezo-electric ceramic transducer 21. Resin, metal, ceramics material and the like can be used as material of stationary part 36.

Material, shape and the like of elastic body 35 are selected such that a displacement of piezo-electric ceramic transducer 21 in a thickness direction thereof at a position, to which stationary part 36 is attached, is set to be smaller than a displacement of piezo-electric ceramic transducer 21 in the thickness direction at an end portion of piezo-electric ceramic transducer 21 in a longitudinal direction thereof. Thereby, a displacement of piezo-electric ceramic transducer 21 caused at the end portion of piezo-electric ceramic transducer 21 in the longitudinal direction becomes large as compared with a displacement of stationary part 36. Therefore, an area neighboring to stationary part 36 can be relatively regarded as a fixed end.

Figure 10A:
[FIG. 10A] A view showing a distribution of displacement in a case where no stationary part is disposed on a piezo-electric ceramic transducer.
Figure 10B:
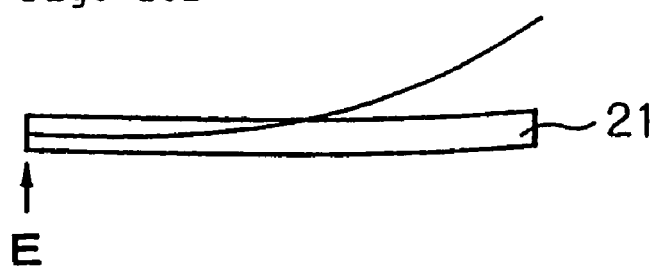
[FIG. 10B] A view showing a distribution of displacement in a case where a stationary part is disposed on a piezo-electric ceramic transducer.

Here, the displacement of piezo-electric ceramic transducer 21 in a thickness direction thereof at positions in a longitudinal direction thereof is considered in a case where a portion of piezo-electric ceramic transducer 21 is fixed. As shown in FIG. 10A, when piezo-electric ceramic transducer 21 not fixed is driven, a distribution of displacement equivalent to almost ½ of a wavelength of a sine wave is obtained. In contrast, as shown in FIG. 10B, when piezo-electric ceramic transducer 21, of which an end E is fixed, is driven, a distribution of displacement equivalent to almost ¼ of the wavelength is obtained. By comparing both distributions with each other, when an end of piezo-electric ceramic transducer 21 is fixed, a wavelength approximately becomes twice as compared with that in a case where piezo-electric ceramic transducer 21 is not fixed. Therefore, a fundamental resonance frequency is reduced to ½.

Even in a case where a middle portion of piezo-electric ceramic transducer 21 in the longitudinal direction thereof is fixed, this result is obtained in the same manner for both an area from stationary part 36 to one terminal B and an area from stationary part 36 to the other end C. In short, a fundamental resonance frequency of piezo-electric ceramic transducer 21 can be lowered by attaching stationary part 36 to piezo-electric ceramic transducer 21.

Further, when stationary part 36 is attached to piezo-electric ceramic transducer 21 at a position away from the center of piezo-electric ceramic transducer 21 in its longitudinal direction, piezo-electric ceramic transducer 21 acts as two different devices, that is, both one device having a length from a position, at which piezo-electric ceramic transducer 21 is fixed by stationary part 36, to one end B, and another device having a length from the position to the other end C. Accordingly, this piezo-electric ceramic transducer 21 has two different fundamental resonance frequencies, and a band of a vibration frequency can be widened.

Mechanical energy caused by driving piezo-electric ceramic transducer 21 can be transmitted through elastic body 35 or be directly transmitted from piezo-electric ceramic transducer 21. Further, in a case where piezo-electric ceramic transducer 21 is vibrated, if an object, to which vibration energy is transmitted, is a housing of a portable device or an elastic body formed in a box shape, not only an area neighboring to stationary part 36 but also the whole surface of the box shaped body can be vibrated by utilizing high vibration transmission efficiency of piezo-electric ceramic transducer 21 according to the present invention. Further, a non-directivity acoustic device performing acoustic radiation from the whole surface of the body and a vibrator having vibration of the whole surface of the body and high output power can be embodied.

As described above, the present invention has been described giving two embodiments. Hereinafter, an embodiment of a portable device, to which embodiments described above are applied, is described.

Figure 11A:
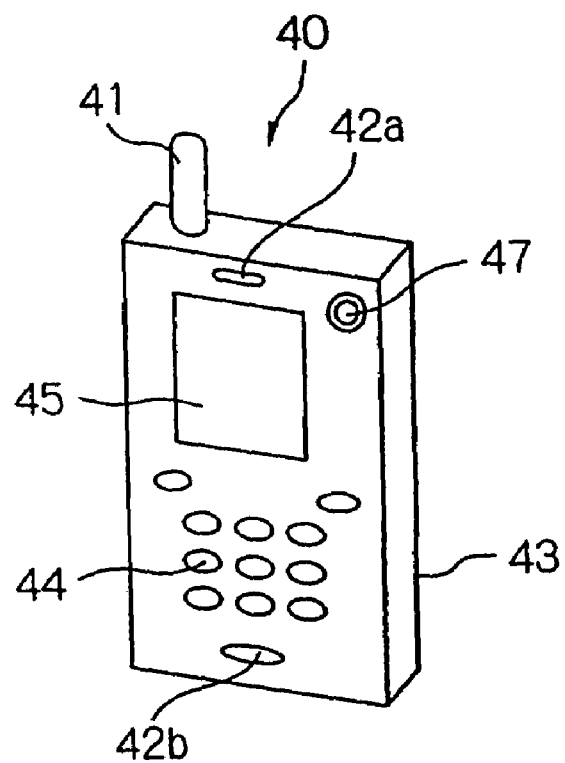
[FIG. 11A] A perspective view showing a portable telephone to which the present invention is applied.
Figure 11B:
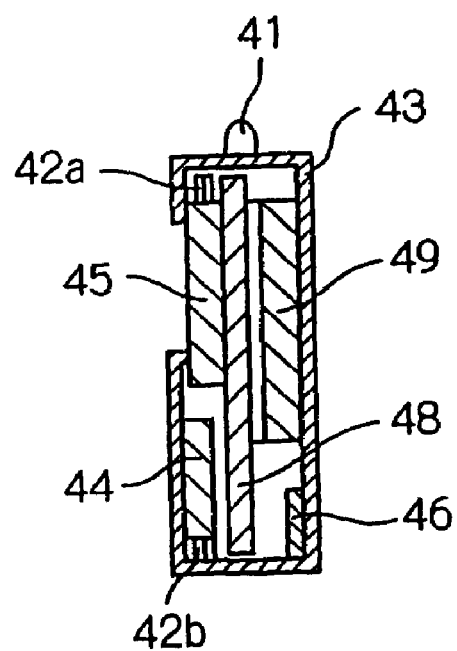
[FIG. 11B] A longitudinal sectional view of a portable telephone shown in FIG. 11A.

Referring to FIGS. 11A and 11B, portable telephone 40 has antenna 41 for transmission and reception of electrical waves, receiver 42a for listening, microphone 42b for talking, operation keys 44 for inputting telephone numbers, data and the like, display 45 for displaying information, speaker 46 for generating incoming sounds and the like, camera 47 for photographing, base plate 48 on which a circuit is disposed to control all operations of this portable telephone, battery 49 for a power source, and the like as functional components. These components are arranged within housing 43.

Since various functional components are installed in portable telephone 40, a installing space inside housing 43 is extremely narrow. To install a large number of functional components in a narrow space, downsizing of functional components is indispensable. Among them, speaker 46 is restricted in downsizing and thinning to obtain desired characteristics is it is of electromagnetic type. In a case where an electromagnetic type speaker is used, sound holes are formed in housing 43. In this case, because acoustic radiates through these sound holes, acoustic radiation has directivity, and the electromagnetic speaker has low output power of sounds.

Therefore, in portable telephone 40 shown in FIGS. 11A and 11B, the piezo-electric ceramic transducer described in the first embodiment or the acoustic device described in the second embodiment is used for this speaker 46. Speaker 36 is directly joined to an inner surface of housing 43. More particularly, in case of a speaker adopting the configuration of the first embodiment, a surface opposite to a surface, on which the electrode pads of the piezo-electric ceramic transducer are disposed, is joined to the case body. In case of a speaker adopting the configuration of the second embodiment, the stationary part is joined to the case body. In any of the cases, housing 43 acts as an elastic body.

When the transducer or the acoustic device according to the present invention is applied to speaker 46, an omnidirectional speaker, which is made in a small size and has a thin thickness, has no necessity of sound holes disposed in housing 43 and generates sounds at high sound level due to acoustic radiation from the whole surface of housing 43, can be substantiated.

Further, the transducer or the acoustic device according to the present invention can be widely applied as various driving sources of a portable device to a high output power vibrator informing a person of incoming of information, a zoom of a digital still camera, a shutter, a receiver and the like, in addition to a speaker, while efficiently using features of a low manufacturing cost, driving at low voltage, a narrow space and high reliability. Industrial worth of the transducer or the acoustic device is very high.

In the following, specific examples of the present invention will be described.

INVENTIVE EXAMPLE 1

Figure 12:
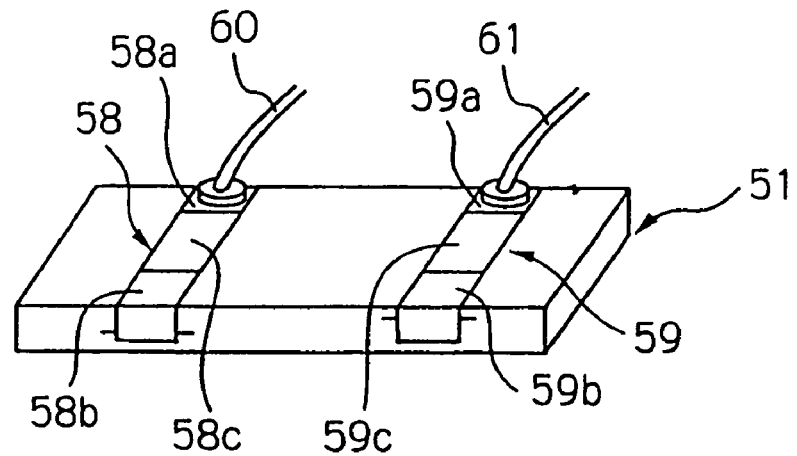
[FIG. 12] A perspective view of a piezo-electric ceramic transducer produced according to Inventive Example 1 of the present invention.
Figure 13:
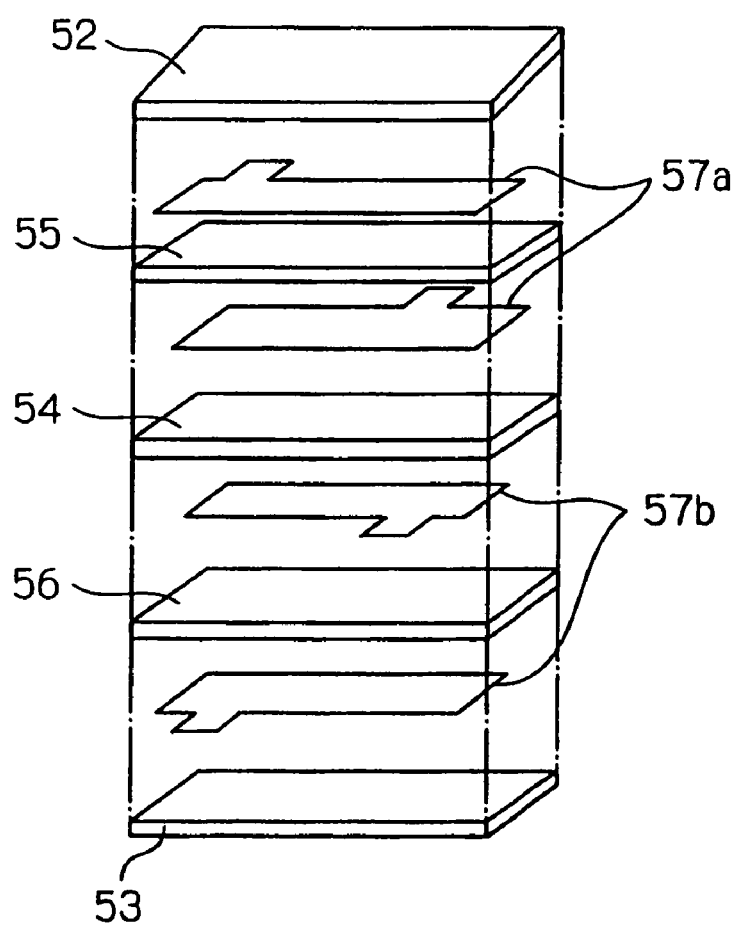
[FIG. 13] A perspective view showing configuration of layers of a piezo-electric ceramic transducer shown in FIG. 12.

In Inventive Example 1, piezo-electric ceramic transducer 51 shown in FIG. 12 was manufactured. The configuration of layers of piezo-electric ceramic transducer 51 shown in FIG. 12 is shown in FIG. 13.

In this Example, fifty piezo-electric ceramic transducers 51 were manufactured. Green sheet method used for manufacturing a ceramic condenser or the like was applied to manufacturing of each piezo-electric ceramic transducer 51. Outside dimensions of piezo-electric ceramic transducer 51 were set to be 35 mm in length, 5 mm in width and 0.532 mm in thickness. Further, the configuration of layers of piezo-electric ceramic transducer 51 was set so as to have upper insulating layer 52, upper piezo-electric active layer 55 composed of a single piezo-electric layer, upper electrode layers 57a disposed on both surfaces of upper piezo-electric active layer 55 in a thickness direction thereof, intermediate insulating layer 54, lower piezo-electric active layer 56 composed of a single piezo-electric layer, lower electrode layers 56a disposed on both surfaces of lower piezo-electric active layer 56 in a thickness direction thereof, and lower insulating layer 53. The thickness of upper insulating layer 52, intermediate insulating layer 54 and lower insulating layer 53 have was 40 µm, the thickness of upper piezo-electric active layer 55 and lower piezo-electric active layer 56 was 200 µm, and the thickness of upper electrode layers 57a and lower electrode layers 57b was 3 µm.

Each of upper electrode layers 57a and lower electrode layers 57b was a partial electrode having a tab so as to expose only a part of the layer to a side surface of piezo-electric ceramic transducer 51. Plane dimensions in length and width, excluding tab, of upper electrode layers 57a and lower electrode layers 57b were smaller than length and width of the other layers by 0.6 mm.

Lead zirconate and titanate type ceramics was used as material of the piezo-electric active layers and the insulating layers. Silver-palladium alloy (mass ratio of 70%:30%) was used as material of electrode layers.

The layers are stacked in an order shown in FIG. 13 and are integrated by sintering. The sintering was performed at 1100° C. for two hours in the atmosphere. After the sintering, sintering distortion of fifty multilayered bodies in a thickness direction thereof was measured. Measured sintering distortion was 15 µm in average.

Four Ag electrodes 58a, 58b, 59a and 59b having a thickness of 8 µm were formed on a portion of an upper surface and a portion of a side surface of each obtained multilayered body so as to be used as pad portions for polarization and wire connection members for electrode layers. Thereafter, a polarization process was performed by using these Ag electrodes 58a, 58b, 59a and 59b so as to make polarization directions in upper piezo-electric active layer 55 and lower piezo-electric active layer 56 be the same as each other. After the polarization process, two electrode pads 58 and 59 were formed on an upper surface of upper insulating layer 52 by connecting Ag electrodes 58a and 58b with each other via coupling portion 58c and by connecting Ag electrodes 59a and 59b with each other via coupling portion 59c. Cupper foil having a thickness of 8 μm was used for coupling portions 58c and 59c. After the formation of electrode pads 58 and 59, lead wires 60 and 61 having a diameter of 0.2 mm were connected to electrode pads 58 and 59 through soldering portions 63 having a diameter of 1 mm and a height of 0.5 mm.

Figure 1:
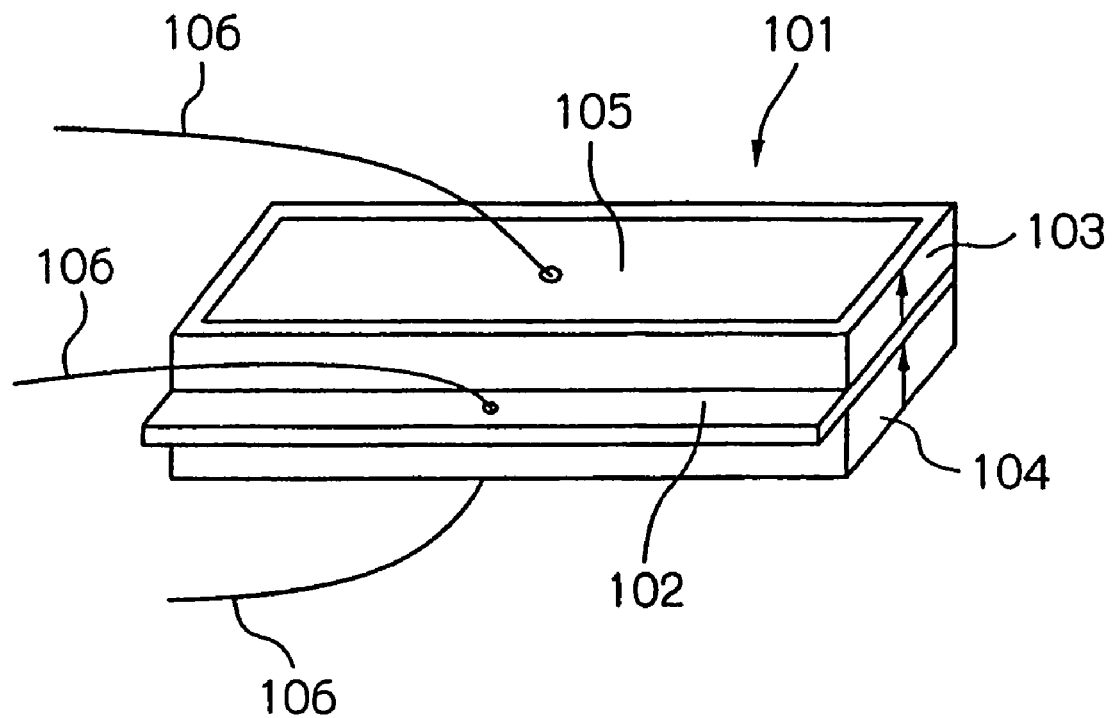
[FIG. 1] A schematic view showing a conventional piezo-electric ceramic transducer.
Figure 2:
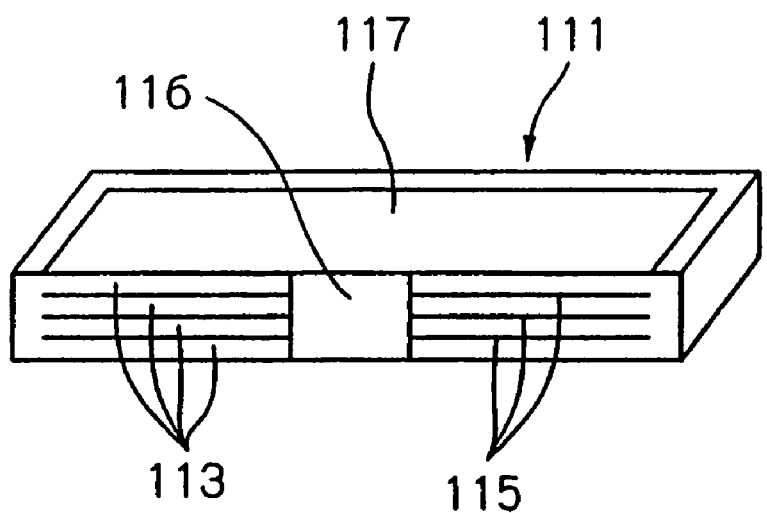
[FIG. 2] A schematic view showing a conventional multi-layered piezo-electric ceramic transducer.

In contrast, for comparison, a piezo-electric ceramic transducer having the configuration shown in FIG. 1 was manufactured. This piezo-electric ceramic transducer is called Comparative Example 1. The piezo-electric ceramic transducer of Comparative Example 1 was manufactured as follows. Piezo-electric plates having a length of 35 mm, a width of 5 mm and a thickness of 200 μm were made by sintering green sheets, made of the same piezo-electric ceramic material as that in the first comparison example, at 1100° C. for two hours in the atmosphere. After sintering, sintering distortion in fifty piezo-electric plates was measured. Measured sintering distortion was 150 μm in average. When these piezo-electric plates were tried to be adhere on a plate of phosphor bronze having sizes of a length of 35 mm, a width of 6.2 mm and a thickness of 120 μm and acting as a permanent body, cracks were generated in the piezo-electric plates, so that the piezo-electric plate could not be joined to the phosphor bronze plate. Therefore, effects of lowering of sintering distortion based on sintering integration according to Inventive Example 1 were ascertained.

Next, as Comparative Example 2, a piezo-electric ceramic transducer was manufactured by using a piezo-electric plate grained and polished after the sintering. In Comparative Example 2, piezo-electric plates having a length of 37 mm, a width of 7 mm and a thickness of 400 μm were made by sintering green sheets, made of the same piezo-electric ceramic material as that in Comparative Example 1, at 1100° C. for two hours in the atmosphere. After the sintering, sintering distortion in fifty piezo-electric plates was measured. Measured distortion is 100 μm in average. These are grained and polished to have sizes of a length of 35 mm, a width of 5 mm and a thickness of 200 μm, and Ag electrodes were formed on both surfaces of each plate.

Thereafter, two piezo-electric plates having the Ag electrodes were joined to both surfaces of a plate of phosphor bronze having sizes of a length of 35 mm, a width of 6.2 mm and a thickness of 120 μm by using epoxy type adhesives. Then, a polarization process is performed for the two piezo-electric plates joined to the phosphor bronze plate, a soldering portion having a diameter of 1 mm and a height of 0.5 mm was formed on each piezo-electric plate, a lead wire having a diameter of 0.2 mm was connected to each soldering portion, and the lead wires are short-circuited each other. Further, a soldering portion having a diameter of 1 mm and a height of 0.5 mm was formed on a portion extended from each piezo-electric plate of the phosphor bronze plate in a width direction thereof, and a lead wire having a diameter of 0.2 mm was connected to each soldering portion. The obtained piezo-electric ceramic transducer has both surfaces, the electrode pad, the soldering joining portion and the lead wire were disposed on each of the surfaces, and the whole thickness of the piezo-electric ceramic transducer were increased.

Fundamental resonance frequencies of the piezo-electric ceramic transducers manufactured as described above in Inventive Example 1 and Comparative Example 2 were measured. The measured fundamental resonance frequencies are 1 kHz. Then, vibration test was performed for piezo-electric ceramic transducers in Inventive example 1 and Comparative Example 2 by applying alternating current voltage having a frequency of 1 kHz and an amplitude of 5V for 1000 hours to the piezo-electric ceramic transducers. The number of samples was 50 for each of the examples.

Immediately after stating the test, an amplitude of vibration of the piezo-electric ceramic transducer at its end along a longitudinal direction thereof was 100 μm for Inventive Example 1 and was 80 μm for Comparative Example 2. The amplitude of vibration was measured by using a laser measuring machine. It is believed that the amplitude of vibration in Comparative example 2 was small because characteristics of piezo-electric material deteriorated due to sintering distortion. After the vibration test for 1000 hours, the piezo-electric ceramic transducer of Inventive example 1 could maintain its stability in operation, but all piezo-electric ceramic transducer of Comparative Example 2 was made inoperative entirely. The 50 samples of Comparative Example 2 were inspected. Detachment between the piezo-electric plate and the phosphor bronze plate was caused in about 60% of the samples, and this detachment was a cause for making the samples inoperative. Detachment caused by electric discharge in 20% among 60% of the samples. Disconnection of the soldering portions occurred in 30% of the samples as a cause for making the samples inoperative. Disconnection of the lead wires occurred in 10% of the samples as a cause for making the samples inoperative.

As described above, Inventive Example 1 can be installed while reducing a space for transducer as compared with Comparative Example 2, and Inventive Example 1 can be stably operated for long hours. Further, because the grinding and polishing process are unnecessary in the piezo-electric ceramic transducer of Inventive Example 1, the piezo-electric ceramic transducer can be easily manufactured and be obtained at low cost.

INVENTIVE EXAMPLE 2

In Inventive example 2, upper and lower piezo-electric active layers were composed of five piezo-electric layers. Except that an electrode layer was disposed between piezo-electric layers adjacent to each other, 50 piezo-electric ceramic transducers were manufactured in the same manner as in Inventive Example 1. Piezo-electric layer in this example was 40 μm in thickness, and the thickness of the whole piezo-electric ceramic transducer was almost the same as that in Inventive Example 1.

In this example, sintering distortion in a multilayered body obtained after sintering is 10 μm in average. As compared with Inventive Example 1, the sintering distortion is lowered by 5 μm. This is an effect due to multi-layer of the piezo-electric active layer.

A fundamental resonance frequency of the piezo-electric ceramic transducer manufactured Inventive Example 2 was measured and was 1 kHz as Inventive Example 1. Then, vibration test was performed for the piezo-electric ceramic transducer of Inventive example 2 by applying alternating current voltage having a frequency of 1 kHz and an amplitude of 1V for 1000 hours to the piezo-electric ceramic transducer. Immediately after stating the test, vibration of the piezo-electric ceramic transducer at its end in a longitudinal direction thereof was 100 μm. That is, the same amplitude of vibration as that in Inventive Example 1 by using the driving voltage which is ⅕ of the driving voltage of Inventive Example 1. Further, the piezo-electric ceramic transducer of Inventive Example 2 was stably operated after the operation was performed for 100 hours as Inventive Example 1.

INVENTIVE EXAMPLE 3

In Inventive example 3, displacement and a variation in a fundamental resonance frequency caused by joining a plate shaped elastic body to a piezo-electric ceramic transducer were estimated.

Initially, piezo-electric ceramic transducers were produced in the same manner as Inventive example 2.

Then, a phosphor bronze plate was joined as an elastic body to a surface opposite to a surface of each piezo-electric ceramic transducer on which electrode pads were joined. Three kinds of phosphor bronze plates, having a width of 5 mm, a thickness of 0.1 mm and lengths of 40 mm, 45 mm and 50 mm were prepared. As shown in FIG. 8, a longitudinal direction of the piezo-electric ceramic transducer was aligned to a longitudinal direction of each prepared phosphor bronze plate, and the piezo-electric ceramic transducer was joined to the phosphor bronze plate at a position away from one end of the phosphor bronze plate by 1 mm by using epoxy type adhesives. 50 samples provided by joining the phosphor bronze plate to the piezo-electric ceramic transducer as described above were produced with respect to each kind of phosphor bronze plate. The other end of the phosphor bronze plate was set to be a fixed end.

Because the piezo-electric ceramic transducer has small sintering distortion, mechanical working for the piezo-electric ceramic transducer was unnecessary when the phosphor bronze plate was joined. Further, in the inspection after the joining, defects such as cracks were not found in the piezo-electric ceramic transducer.

When a fundamental resonance frequency of each produced sample was measured, different results depending on the length of the phosphor bronze plate were obtained. The measured results are shown in Table 1.

TABLE 1

| length of phosphor bronze plate (mm) | fundamental resonance frequency (kHz) |
| --- | --- |
| 40 | 0.6 |
| 45 | 0.4 |
| 50 | 0.25 |

Referring to Table 1, it is realized that as the length of the phosphor bronze plate joined to the piezo-electric ceramic transducer becomes large, the fundamental resonance frequency is lowered.

A vibration test was performed by applying an alternating current voltage having a frequency of 0.4 kHz and an amplitude of 1V to each sample for 1000 hours. An amplitude of vibration at an end of the piezo-electric ceramic transducer in a longitudinal direction thereof at a time just after starting the vibration test is shown in Table 2.

TABLE 2

| length of phosphor bronze plate (mm) | Amplitude of vibration (μm) |
| --- | --- |
| 40 | 200 |
| 45 | 280 |
| 50 | 350 |

Referring to Table 2, it is realized that as the length of the phosphor bronze plate joined to the piezo-electric ceramic transducer becomes large, the amplitude of vibration is enlarged. Further, the amplitude of vibration, which is twice as compared with that in the piezo-electric ceramic transducer of Inventive Example 2, is obtained. Moreover, when a flow of an electric current was checked during the vibration test by connecting an ammeter to the phosphor bronze plate, no leaking of current was observed. Furthermore, the piezo-electric ceramic transducer was stably operated after the elapsed time of 1000 hours.

INVENTIVE EXAMPLE 2

Figure 14:
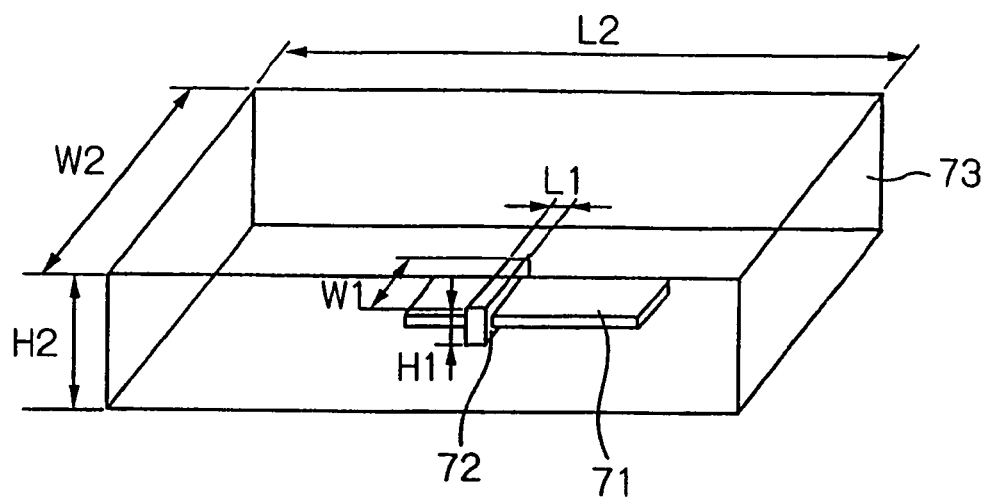
[FIG. 14] A perspective view showing an acoustic device produced according to Inventive Example 4.

In Inventive Example 4, adjustment of both a displacement and a fundamental resonance frequency in an acoustic device having a piezo-electric ceramic transducer, on which a stationary part is disposed, was estimated. This example will be described below with reference to FIG. 14.

Piezo-electric ceramic transducer 71 was made in the same manner as the production in Inventive Example 2.

Then, stationary part 72 made of ABS resin was adhered on piezo-electric ceramic transducer 71 with epoxy adhesives. Stationary part 72 has external dimensions of a length L1 of 3 mm, a width W1 of 6 mm and a height H1 of 2 mm. A through hole for receiving piezo-electric ceramic transducer 71 is formed in a center portion of stationary part 72, and piezo-electric ceramic transducer 71 is inserted and supported in the through hole. In this example, to estimate a change in characteristics depending on a position of stationary part 72, three samples were prepared. Stationary parts 72 of the samples were, respectively, disposed at positions away from the center of piezo-electric ceramic transducer 71 in a longitudinal direction thereof by 0 mm, 9 mm and 14 mm.

Each sample was fixed at a center position of a primary surface inside dummy housing 73 acting as an elastic body, and a condition that as if piezo-electric ceramic transducer 71 was installed inside a portable device was reproduced. Dummy housing 73 was made of transparent polycarbonate resin and has a length L2 of 120 mm, a width W2 of 80 mm, a height H2 of 6 mm and a thickness of 3 mm. The reason that dummy housing 73 was made of transparent material is to make a amplitude of vibration in piezo-electric ceramic transducer 71 be possible to be measured by a laser measuring device. Samples were fixed to dummy housing 73 with epoxy type adhesives.

For each sample obtained as described above, an alternating current voltage of 1V was applied to piezo-electric ceramic transducer 71 while changing frequency, and a fundamental resonance frequency of piezo-electric ceramic transducer 71 at its end in a longitudinal direction thereof, a amplitude of vibration of piezo-electric ceramic transducer 71 at the fundamental resonance frequency, a resonance frequency of stationary part 72 and a amplitude of vibration of stationary part 72 at the resonance frequency were measured. Particularly, in the sample in which stationary part 72 is fixed at a position away from the center of piezo-electric ceramic transducer 71 by 9 mm, a distance from stationary part 72 to one end of piezo-electric ceramic transducer 71 differs from a distance from stationary part 72 to the other end of piezo-electric ceramic transducer 71. Therefore, the larger distance was expressed by 9 mm(A), the smaller distance was expressed by 9 mm(B), and measurement was executed for both distances.

In addition, an effective sound pressure level at each resonance frequency was measured. The effective sound pressure level was measured by positioning a microphone which is placed over the center of a surface of dummy housing 73, on which piezo-electric ceramic transducer 71 is fixed, and to be away from the surface by 10 cm in a vertical direction.

These measuring results are shown in Table 3.

TABLE 3

| position of stationary part from center of piezo-electric ceramic transducer | 0 mm | 9 mm (A) | 9 mm (B) | 14 mm |
|---|---|---|---|---|
| fundamental resonance frequency of piezo-electric ceramic transducer at its end | 500 Hz | 350 Hz | 750 Hz | 200 Hz |
| amplitude of vibration in piezo-electric ceramic transducer at its end | 90 μm | 110 μm | 80 μm | 130 μM |
| resonance frequency of stationary part | 500 Hz | 350 Hz | 750 Hz | 200 Hz |
| amplitude of vibration in stationary part | 20 μm | 22 μm | 15 μm | 25 μm |
| Effective sound pressure level | 80 dB Parms | 85 dB Parms | 78 dB Parms | 90 dB Parms |

Based on the results shown above, in the sample in which stationary part 72 is fixed at a position away from the center of piezo-electric ceramic transducer 71 by 9 mm, it is realized that two fundamental resonance frequencies are obtained in one piezo-electric ceramic transducer 71. Further, because the amplitude of vibration of piezo-electric ceramic transducer 71 at its end is larger than that of stationary part 72, a position at which stationary part 72 is fixed can be approximately regarded as a fixed end, and the fundamental resonance frequency becomes lower than that of Inventive Example 2. Accordingly, it is realized that the resonance frequency is changed in dependent on both a fixed position of stationary part 72 to piezo-electric ceramic transducer 71 and an elastic body fixed to stationary part 72.

Further, a vibration transmission efficiency is high in each sample, and each sample has a sound pressure level sufficiently usable as an acoustic device. Particularly, because the sample, in which stationary part 72 is fixed at a position away from the center of piezo-electric ceramic transducer 71, has two fundamental resonance frequencies, application as a speaker of a wide band can be expected for the sample.

Moreover, behavior of dummy housing 73 was observed, and it was observed that vibration energy of piezo-electric ceramic transducer 71 is transmitted from a position, at which stationary part 72 was fixed, and the whole surface of dummy housing 73 was vibrated in the same manner as stationary part 72. When this vibration is utilized, an omnidirectional speaker can be produced with a housing of a portable device.

In order to ascertain this, following experiments were executed.

Figure 15:
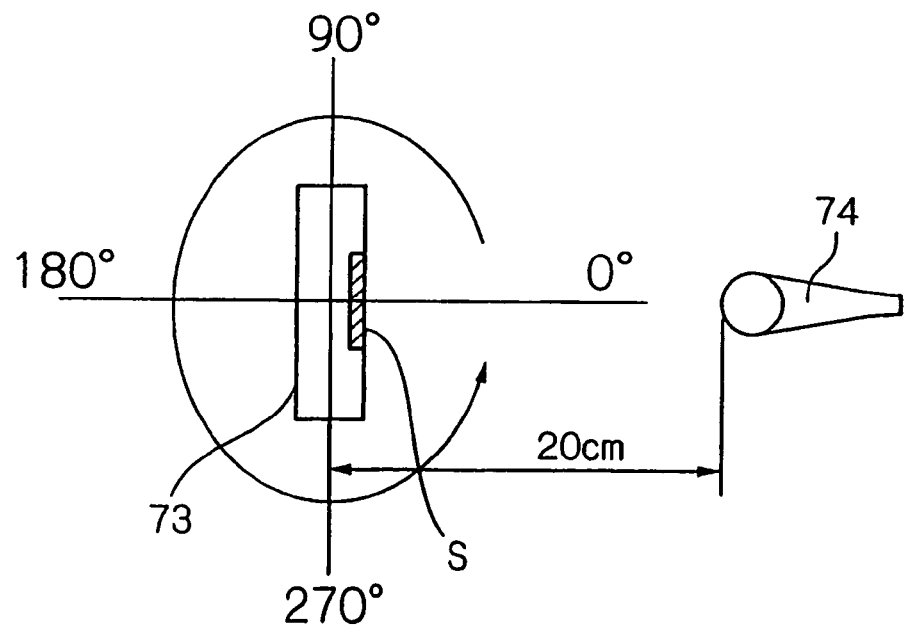
[FIG. 15] A view explaining a method of a test performed to ascertain non-directivity of an acoustic device shown in FIG. 14.
Figure 16:
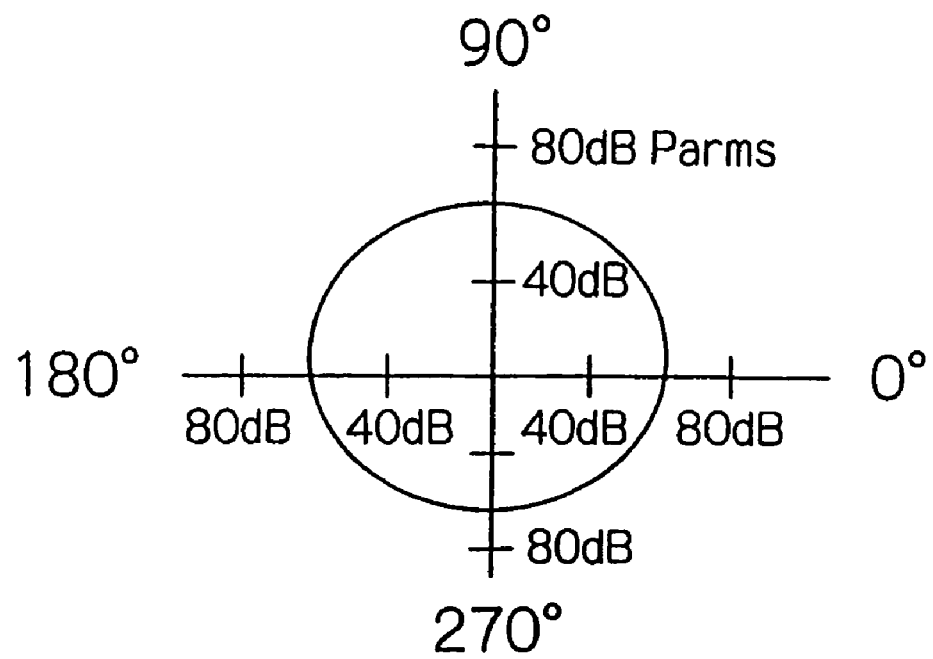
[FIG. 16] A graph showing results of measurement of sound pressure levels in the test performed according to the method shown in FIG. 15.

As shown in FIG. 15, among the samples described above, the sample S, in which the stationary part is fixed at a position away from the center of the piezo-electric ceramic transducer by 9 mm, was fixed at a center position of an inner primary surface of dummy housing 73. Then, an alternating current voltage of 1V was applied to the sample S at a frequency of 350 Hz which was one of the fundamental resonance frequencies, dummy housing 73 is rotated on its center axis while vibrating a piezo-electric ceramic transducer, and an effective sound pressure level was measured. Microphone 74 for measurement was placed at a position away from the rotation axis of dummy housing 73 by 20 cm. Measurement results of the sound pressure level are shown in FIG. 16.

In this measurement, a condition that a surface, to which the sample S of pseudo-case body 73 is fixed, faces microphone 74 is set at 0°. Referring to FIG. 16, characteristics of omnidirectional acoustic radiation are apparently realized. In these characteristics, in a case where a conventional electromagnetic type speaker is used for a folding type portable telephone, when sound holes formed in a housing are obstructed, acoustic radiation undesirably becomes impossible. However, in case of this experiment, this problem can be solved by acoustic radiation from the whole surface of the housing. Further, even when the portable telephone is of folding type, acoustic radiation can be executed. Therefore, convenience for users can be improved.

In this example, piezo-electric ceramic transducer 71 was stably operated after the elapsed time of 1000 hours, the same as in Inventive Examples 1 to 3.

The invention claimed is:

1. A piezo-electric ceramic transducer which bends in a thickness direction thereof by applying voltage to the transducer, the transducer comprises:

two-piezo-electric active layers having at least one piezo-electric layer respectively, said piezo-electric active layers being applied voltages via electrode layers so that one of said piezo-electric active layer expands and the other one contracts, an intermediate insulating layer disposed between said two piezo-electric active layers, two surface insulating layers, between which said two piezo-electric active layers are placed, disposed on both surfaces of said piezo-electric ceramic transducer in a thickness direction thereof, electrode pads disposed on only one of said two surface insulating layers and electrically connected with said electrode layers, wherein said piezo-electric active layers, said intermediate layer and said surface insulating layers are made of the same material as one another and are integrated with one another by sintering, and wherein the electrode pad comprises;

two first pad portions for polarization electrically connected with said electrode layer of one of said piezo-electric active layers, and two second pad portions for polarization electrically connected with said electrode layer of the other piezo-electric active layer, said first and second pad portions being used in a polarization process for said piezo-electric layers; and a coupling portion for coupling the first pad portions with the second pad portions.

2. A piezo-electric ceramic transducer which bends in a thickness direction thereof by applying voltage to the transducer, the transducer comprises:

two-piezo-electric active layers having at least one piezo-electric layer respectively, said piezo-electric active layers being applied voltages via electrode layers so that one of said piezo-electric active layer expands and the other one contracts, an intermediate insulating layer disposed between said two piezo-electric active layers, two surface insulating layers, between which said two piezo-electric active layers are placed, disposed on both surfaces of said piezo-electric ceramic transducer in a thickness direction thereof, electrode pads disposed on only one of said two surface insulating layers and electrically connected with said electrode layers, wherein said piezo-electric active layers, said intermediate layer and said surface insulating layers are made of the same material as one another and are integrated with one another by sintering, and wherein a part of said piezo-electric ceramic transducer is fixed to an elastic body via a stationary part, a displacement of said elastic body at a position which said stationary part is fixed is smaller than a maximum displacement of the piezo-electric ceramic transducer, and wherein said elastic body is a box, and said piezo-electric ceramic transducer is attached to an inside port ion of said box.

3. A portable device comprising:

a piezo-electric ceramic transducer which bends in a thickness direction thereof by applying voltage to the transducer, the transducer comprises:

two-piezo-electric active layers having at least one piezo-electric layer respectively, said piezo-electric active layers being applied voltages via electrode layers so that one of said piezo-electric active layer expands and the other one contracts, an intermediate insulating layer disposed between said two piezo-electric active layers, two surface insulating layers, between which said two piezo-electric active layers are placed, disposed on both surfaces of said piezo-electric ceramic transducer in a thickness direction thereof, electrode pads disposed on only one of said two surface insulating layers and electrically connected with said electrode layers, wherein said piezo-electric active layers, said intermediate layer and said surface insulating layers are made of the same material as one another and are integrated with one another by sintering, a stationary part attached to said piezo-electric ceramic transducer, an elastic body, joined to said stationary part, which makes a displacement of said stationary part to become smaller than a displacement of said piezo-electric ceramic transducer at an end of said piezo-ceramic transducer, and wherein an acoustical radiation is generated form said elastic body.

4. The portable device according to claim 3, wherein said elastic body is a case body of the portable device.

5. The portable device according to claim 3, wherein said stationary part is attached to a position different from a position of a center of said piezo-electric ceramic transducer.

* * * * *